(12) United States Patent
Choi

(10) Patent No.: US 8,122,597 B2
(45) Date of Patent: Feb. 28, 2012

(54) METHOD FOR FABRICATING LIGHT EMITTING DIODE SIGNBOARD

(75) Inventor: Kwan Soo Choi, Gyeonggi-do (KR)

(73) Assignee: Digital Graphics Incorporation, Gyeonggi-Do (KR)

( * ) Notice: Subject to any disclaimer, the term of this patent is extended or adjusted under 35 U.S.C. 154(b) by 0 days.

(21) Appl. No.: 12/789,093

(22) Filed: May 27, 2010

(65) Prior Publication Data

US 2011/0271517 A1    Nov. 10, 2011

(30) Foreign Application Priority Data

May 7, 2010    (KR) ........................ 10-2010-0043086

(51) Int. Cl.
*H05K 3/30* (2006.01)
(52) U.S. Cl. ............... 29/832; 29/825; 29/840; 438/125
(58) Field of Classification Search ................... 29/825, 29/832, 840; 438/125
See application file for complete search history.

(56) References Cited

U.S. PATENT DOCUMENTS

| | | | | |
|---|---|---|---|---|
| 7,168,058 B2* | 1/2007 | Harada et al. | ................. | 716/112 |
| 7,550,235 B2* | 6/2009 | Shi et al. | ........................... | 430/5 |
| 7,550,319 B2* | 6/2009 | Wang et al. | ................... | 438/125 |
| 7,736,830 B2* | 6/2010 | Kamada et al. | ............ | 430/120.2 |
| 7,842,526 B2* | 11/2010 | Hadame et al. | ................. | 438/29 |
| 2002/0185966 A1* | 12/2002 | Murano | ........................ | 313/501 |
| 2007/0057364 A1* | 3/2007 | Wang et al. | ................... | 257/701 |

* cited by examiner

*Primary Examiner* — Carl Arbes
(74) *Attorney, Agent, or Firm* — Saliwanchik, Lloyd & Eisenschenk

(57) ABSTRACT

The present disclosure relates to a method and apparatus for fabricating an LED signboard, through which an LED signboard is fabricated by printing a circuit pattern with a conductive ink. The method includes generating a design, forming a circuit pattern by printing a conductive ink on an insulation matrix based on the design via a printer, and mounting an LED on the circuit pattern.

4 Claims, 4 Drawing Sheets

METHOD FOR FABRICATING LIGHT EMITTING DIODE SIGNBOARD

CROSS-REFERENCE TO RELATED APPLICATION

This application claims the benefit under 35 U.S.C. §119(a) of Korean Patent Application No. 10-2010-0043086, filed on May 7, 2010, which is hereby incorporated by reference in its entirety.

FIELD OF THE INVENTION

The present invention relates to a light emitting diode (LED) module and, more particularly, to a method and apparatus for fabricating an LED signboard by printing a circuit pattern with a conductive ink.

DESCRIPTION OF THE RELATED ART

Traffic signboards, information panels, advertisement boards, or the like are provided with lighting to illuminate printed or painted information for clearer recognition at night. The lighting is disposed inside the signboard or disposed outside the signboard to face the signboard.

In recent years, light emitting diodes (LEDs) are used for lighting. LEDs refer to junction diodes of intermetallic compound semiconductors such as GaAs, GaP, GaAsP, and the like.

Such an LED is used to display a letter and a numeral on an electronic advertisement board and can achieve optical output of various colors, such as white, blue, and the like, thereby allowing the letter or numeral displayed on the board to be recognized even at a remote place.

It should be understood that the aforementioned techniques refer to the related art to which the invention pertains, and are not conventional techniques.

A conventional LED module is mounted on a hard printed circuit board by soldering LEDs. Such a soldering process causes an increase in fabrication time of the LED module.

In addition, since a circuit pattern must be formed on the printed circuit board through etching and the like, the conventional LED module consumes considerable costs.

BRIEF SUMMARY

The present invention is conceived to solve such problems of the related art, and an aspect of the present invention is to provide a method and apparatus for fabricating an LED signboard, in which operation data for each fabrication module are extracted from designs obtained by creating a vector drawing of a circuit board for an LED module, and are then sent to the fabrication modules to fabricate the LED signboard through the fabrication modules.

Another aspect of the present invention is to provide an LED signboard that can emit uniform light through LEDs and is fabricated via an automated process.

In accordance with an aspect of the invention, a method of fabricating an LED signboard includes: generating a design using a design module; sending operation data to fabrication modules by generating the operation data for operation of the fabrication modules from image data of the design; and fabricating the LED signboard according to the operation data using the fabrication modules.

The step of sending operation data may include extracting and compiling process data corresponding to the fabrication modules from the image data.

The step of fabricating the LED signboard may include: generating a circuit pattern by printing the circuit pattern on an insulation matrix with a conductive ink; mounting an LED on the circuit pattern; forming a circuit board by applying a solder paste to the circuit pattern; cutting a crop region of the insulation matrix according to the circuit pattern; and combining the circuit board and an outer frame.

In accordance with another aspect of the invention, a method of fabricating an LED signboard includes: generating a design; forming a circuit pattern by printing the circuit pattern on an insulation matrix with a conductive ink based on the design via a printer; and mounting an LED on the circuit pattern.

The step of forming a circuit pattern may include extracting process data for the printer from image data of the design and compiling the process data into operation data for operation of the printer.

The method may further include applying a solder paste to the circuit pattern after mounting the LED on the circuit pattern.

The method may further include cutting the insulation matrix after mounting the LED on the circuit pattern.

In accordance with a further aspect of the invention, an apparatus for fabricating an LED signboard includes: a design module that generates a design; and an integrated control module that generates operation data for fabrication modules by compiling process data for the fabrication modules from image data of the design generated by the design module, and sends the operation module to the fabrication modules.

The fabrication module may include: a printer that prints a circuit pattern on an insulation module with a conductive ink according to the operation data to form the circuit pattern; a chip mounter that mounts an LED on the circuit pattern according to the operation data; a dispenser that applies a solder paste to the circuit pattern according to the operation data; a cutting plotter and a channel bender that cuts the insulation matrix and forms a frame according to the operation data, respectively; and an assembly unit that assembles the insulation matrix and the frame.

The integrated control module may include a raster image processing unit that compiles the process data into operation data for operation of the printer and sends the compiled operation data to the printer; a cutting server that compiles the process data into operation data for operation of the cutting plotter, the channel bender and the assembly unit; a vector pointer server that compiles the process data into operation data for operation of the chip mounter and the dispenser, and sends the compiled operation data to the chip mounter and the dispenser; and an integrated vector data management unit that outputs the process data to the raster image processing unit, the cutting server and the vector pointer server, respectively, receives the operation data for the cutting plotter, the channel bender and the assembly unit from the cutting server, and sends the received operation data to the cutting plotter, the channel bender and the assembly unit.

BRIEF DESCRIPTION OF THE DRAWINGS

The above and other aspects, features and advantages of the invention will become apparent from the following detailed description in conjunction with the accompanying drawings, in which.

DETAILED DESCRIPTION

Embodiments of the invention will now be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the invention into account and can be changed according to the custom or intention of users or operators. Therefore, definition of the terms should be made according to the overall disclosure set forth herein.

Figure 1:
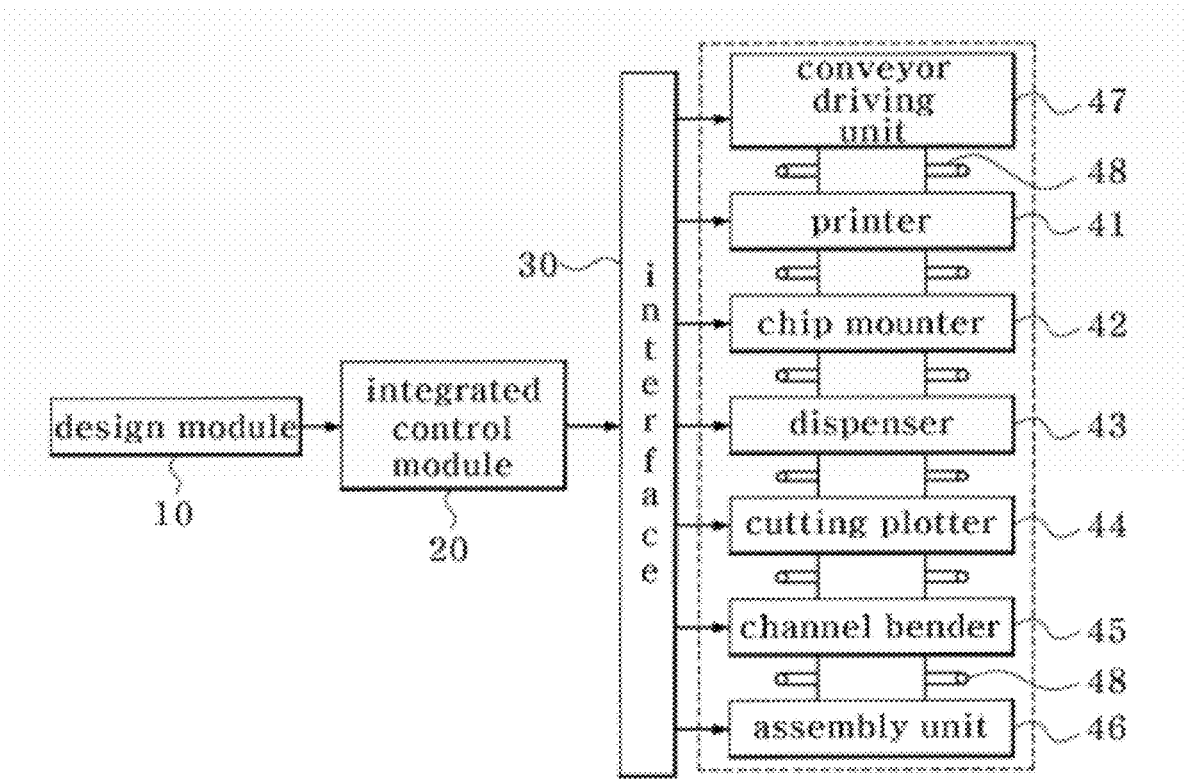
FIG. 1 is a block diagram of an apparatus for fabricating an LED signboard in accordance with an embodiment of the present invention.

FIG. 1 is a block diagram of an apparatus for fabricating an LED signboard in accordance with an embodiment of the present invention.

Referring to FIG. 1, an apparatus for fabricating an LED signboard according to an embodiment of the invention includes a design module 10 that generates a design for an LED signboard; an integrated control module 20 that generates operation data for operation of fabrication modules 40 from image data of the design generated by the design module 10 and sends the generated operation data to the fabrication modules 40; an interface 30 that sends the operation data generated by the integrated control module 20 to the respective fabrication modules 40; and the fabrication modules 40 that fabricate the signboard according to the operation data sent through the interface 30.

Figure 2:
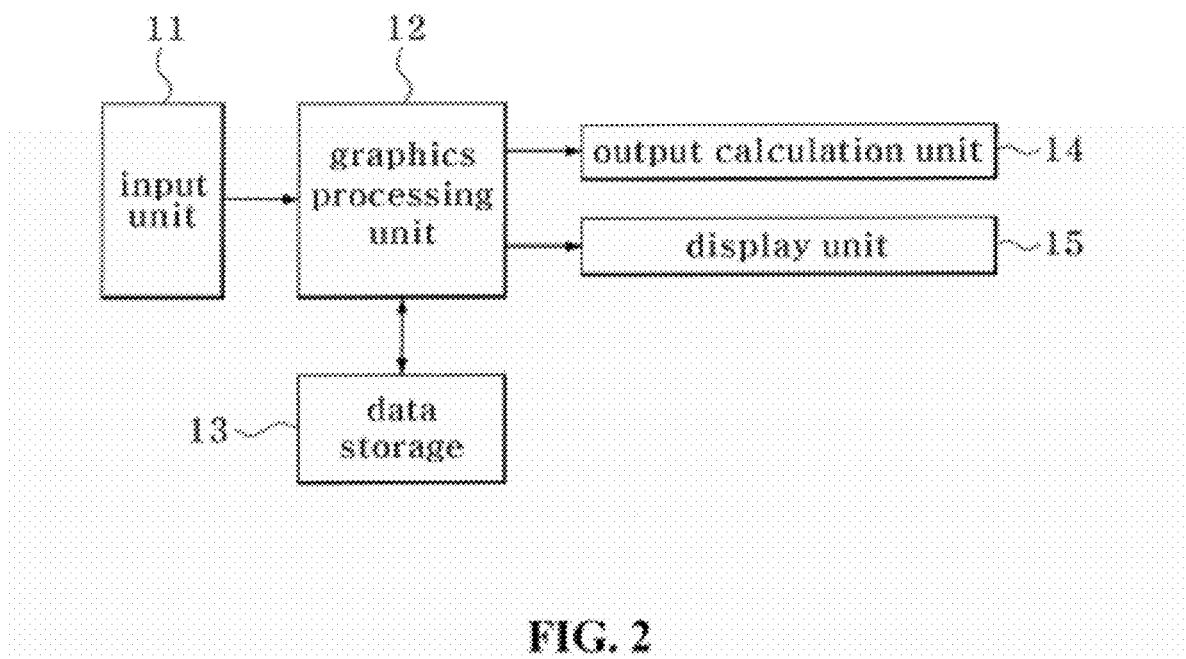
FIG. 2 is a block diagram of a design module in accordance with an embodiment of the present invention.
Figure 3:
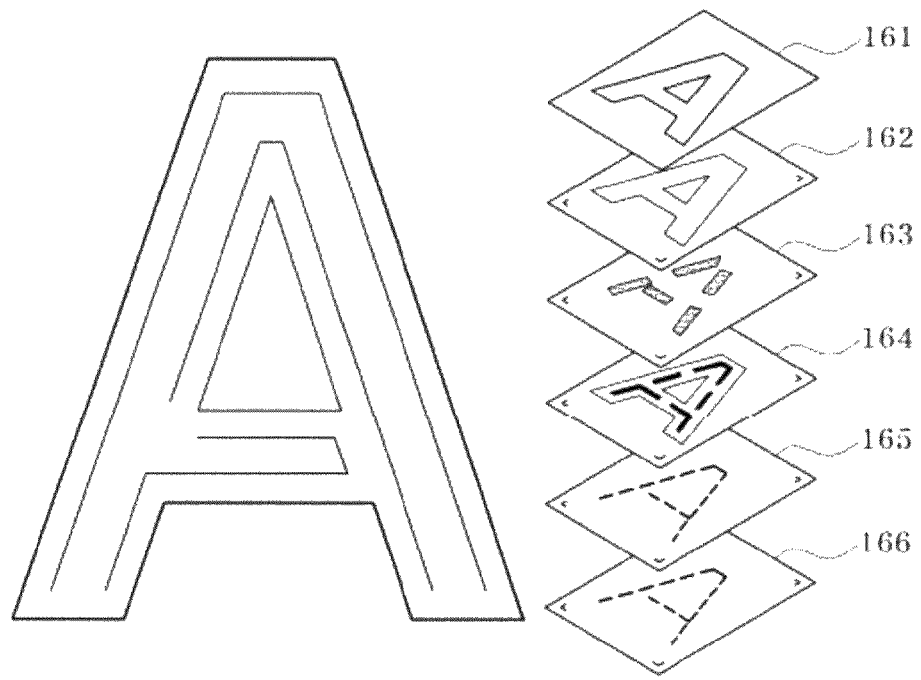
FIG. 3 shows an example of an LED module design obtained through the design module in accordance with the embodiment of the present invention.

FIG. 2 is a block diagram of a design module in accordance with an embodiment of the invention, and FIG. 3 shows an example of an LED module design obtained through the design module in accordance with the embodiment of the invention.

The design module 10 generates designs for an LED signboard in a vector manner. In other words, a user draws various designs to be displayed through a signboard. Here, the designs refer to various pieces of information to be displayed through the signboard. The designs include letters, pictures and the like according to targets of the information.

The design module 10 includes an input unit 11, a graphics processing unit 12, a data storage 13, an output calculation unit 14, and a display unit 15.

The input unit 11 inputs various commands of a user to allow the user to draw the designs. The input unit 11 includes a typical keyboard and a mouse.

The graphics processing unit 12 generates various designs by graphics processing in a vector manner in accordance with the commands input from the input unit 11.

The data storage 13 stores various programs for generating the designs through the graphics processing unit 12, and the designs generated thereby.

The output calculation unit 14 calculates a load for circuit operation when LEDs are mounted on a circuit pattern generated according to the designs. In other words, the output calculation unit 14 calculates the load depending on voltage and current applied to the LEDs or an amount of light depending on the number of LEDs, and sends the calculated load or the amount of light to the display unit 15.

The display unit 15 allows the designs generated by the graphics processing unit 12 to be displayed along with the load calculated by the output calculation unit 14 on a screen.

In FIG. 3, a letter "A" is drawn as an example through the design module 10.

Referring to FIG. 3, process data for the fabrication modules 40 are displayed in the form of layers.

First, a cutting layer 161 indicates a cutting line for cutting an insulation matrix in an "A" shape corresponding to a desired design.

A crop marker layer 162 indicates a cutting line for cutting a contour of the "A" shape.

A circuit pattern layer 163 indicates regions to be printed with a conductive ink.

A pattern protection coating layer 164 indicates points for forming an insulation layer to protect a circuit pattern.

An LED point layer 165 indicates points on which LEDs will be mounted.

An LED coating layer 166 indicates points to which a protection coating for protecting the LEDs, that is, a solder paste, will be applied.

Figure 4:
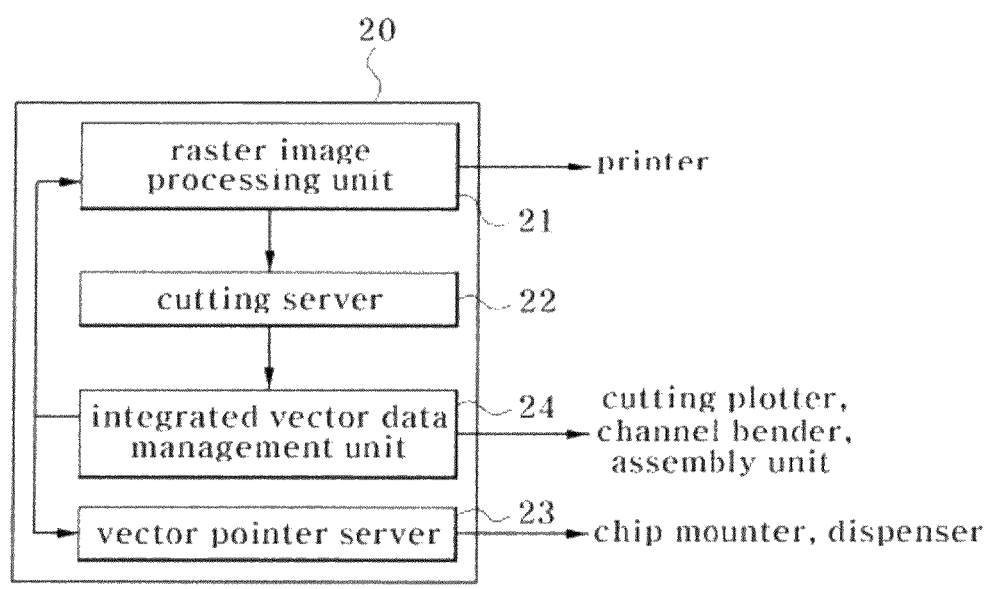
FIG. 4 is a block diagram of an integrated control module in accordance with an embodiment of the present invention.
Figure 5:
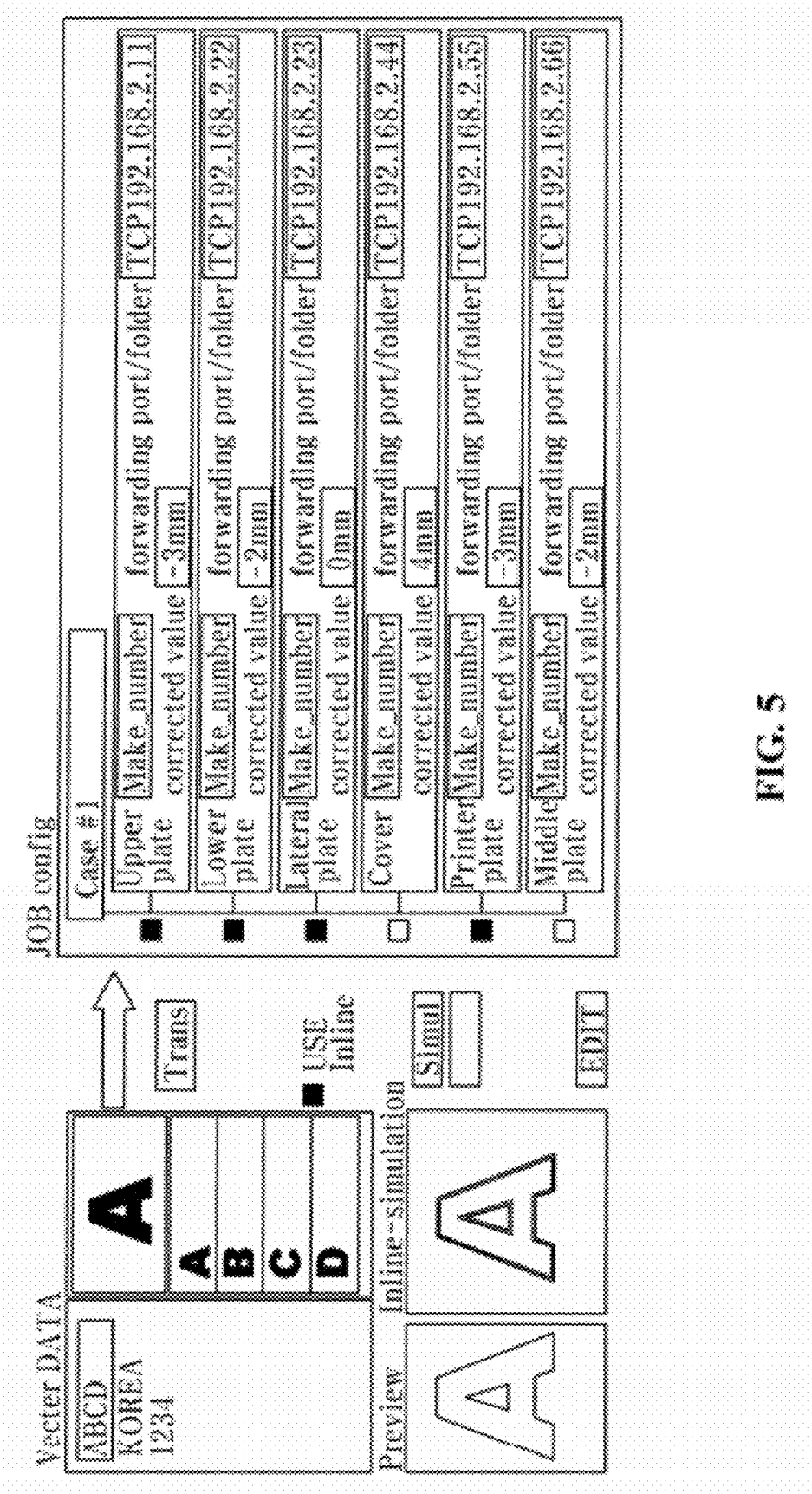
FIG. 5 shows an example of a signboard design obtained through the integrated control module in accordance with the embodiment of the present invention.

FIG. 4 is a block diagram of an integrated control module in accordance with an embodiment of the invention, and FIG. 5 shows an example of a signboard design obtained through the integrated control module in accordance with an embodiment of the invention.

The integrated control module 20 includes a raster image processing unit 21, a cutting server 22, a vector pointer server 23, and an integrated vector data management unit 24.

The integrated control module 20 compiles image data of a design generated by the design module 20 to generate operation data for operation of the fabrication modules 40, and sends the generated operation data to the corresponding fabrication modules 40 through an interface 30.

The integrated vector data management unit 24 categorizes the process data for the fabrication modules based on the image data of the design, which is generated by the design module 10, and inputs the categorized process data into the raster image processing unit 21, the cutting server 22 and the vector pointer server 23.

The integrated vector data management unit 24 outputs process data, which indicate the design, a cutting contour line, and a crop region according to the circuit pattern, to the raster image processing unit 21. Further, the integrated vector data management unit 40 outputs process data, which include a direction vector, a dispenser point, and the crop region, to the vector pointer server 23.

On the other hand, when receiving operation data obtained by compiling the process data indicating the cutting contour line and the crop region by the cutting server 22, the integrated vector data management unit 24 sends the operation data and genuine contour line data to the cutting plotter 44, the channel bender 45 and the assembly unit 46 among the fabrication modules 40.

Particularly, the integrated vector data management unit 24 is provided with a file management section (not shown) for storing designs generated by the design module 10 and various data required for the design module 10 to generate the designs.

The file management section stores the operation data compiled by the raster image processing unit 21, the cutting server 22, and the vector pointer server 23. Here, the operation data is stored in the sequence of designs or output.

When receiving the process data indicating the design, cutting contour line and crop region from the integrated vector data management unit 24, the raster image processing unit 21 converts the process data into operation data, that is, a pixel pattern data, and sends operation data to the printer 41.

Then, the printer 41 forms an insulation layer based on the design and prints a circuit pattern with a conductive ink.

When receiving the process data indicating the cutting contour line and the crop region from the integrated vector data management unit 24, the cutting server 22 converts the process data into operation data and outputs the operation data to the integrated vector data management unit 24.

When receiving process data including a direction vector, dispenser point and crop region, the vector point server 23 generates operation data for operation of the chip mounter 42 and the dispenser 43 by compiling the process data, and sends the operation data to the chip mounter 42 and the dispenser 43.

Accordingly, the chip mounter 42 mounts an LED on a corresponding coordinate according to the operation data.

Furthermore, the dispenser 43 applies a solder paste to the corresponding coordinate according to the operation data.

On the other hand, the interface 30 is connected to the respective fabrication modules 40 to send the operation data generated by the integrated control module 20 to the respective fabrication modules 40.

The fabrication modules 40 are used to fabricate an LED signboard according to the operation data sent from the integrated control module 20, and include the printer 41, chip mounter 42, dispenser 43, cutting plotter 44, channel bender 45, and assembly unit 46.

The printer 41 forms electrodes of an LED by printing a conductive ink in an ink jet manner. That is, the printer 41 prints a circuit pattern on one side of a flexible insulation matrix (not shown) with the conductive ink. Further, the printer 41 forms the insulation layer to prevent short circuit while allowing the LED to be stably mounted.

The chip mounter 42 serves to mount the LED on the circuit pattern generated by the printer 41. When the corresponding coordinate to place the LED is input after compiling by the vector pointer server 23, the LED is mounted on the coordinate of the circuit pattern printed by the printer 41

The dispenser 43 serves to apply the solder paste to the corresponding coordinate of the circuit pattern on which the LED is mounted by the chip mounter 42.

When receiving operation data indicating a crop region, and upper, middle and lower plates from the integrated vector data management unit 24, the cutting plotter 44 recognizes and cuts the crop region of the insulation matrix for a circuit board, and cuts the upper, lower and middle plates after extracting the upper, lower and middle plates.

When receiving operation data from the integrated vector data management unit 24, the channel bender 45 forms a frame of the signboard by extracting the contour line and bending the upper and lower plates.

The assembly unit 46 combines the circuit board and the frame to fabricate the signboard.

In other words, the cutting plotter 44 and the channel bender 45 form the frame, in which the circuit board will be embedded, and the assembly unit 46 combines the circuit board and the frame to fabricate the final signboard.

On the other hand, the respective fabrication modules 41 to 46 are disposed along a conveyor belt 48, which is moved by a conveyor driving unit 47, so that the fabrication process is sequentially carried out.

FIG. 5 shows an example of a signboard design, showing "A" among vector data "ABCD" generated in a vector manner.

For reference, a process of applying and mounting a circuit pattern and LEDs related to "A" is the same as that described with reference to FIG. 3 (in FIG. 5, a vector image is simply indicated as a "print plate"). Therefore, a process of combining upper, lower and middle plates will be described herein with reference to FIG. 5.

Referring to FIG. 5, in order to fabricate the upper and lower plates, a forwarding port/folder (TCP 192.168.2.11) of the cutting plotter 44 is set to indicate transmission of operation data indicating a crop region and operation data indicating a genuine contour line to this forwarding port/folder. This process is also applied to a process of fabricating a lateral plate, a cover, a print plate, and the middle plate.

On the other hand, white boxes in FIG. 5 indicate that the cover and the middle plate have yet to be fabricated at this stage.

Next, an operating process of the apparatus for fabricating an LED signboard according to an embodiment of the invention will be described.

Figure 6:
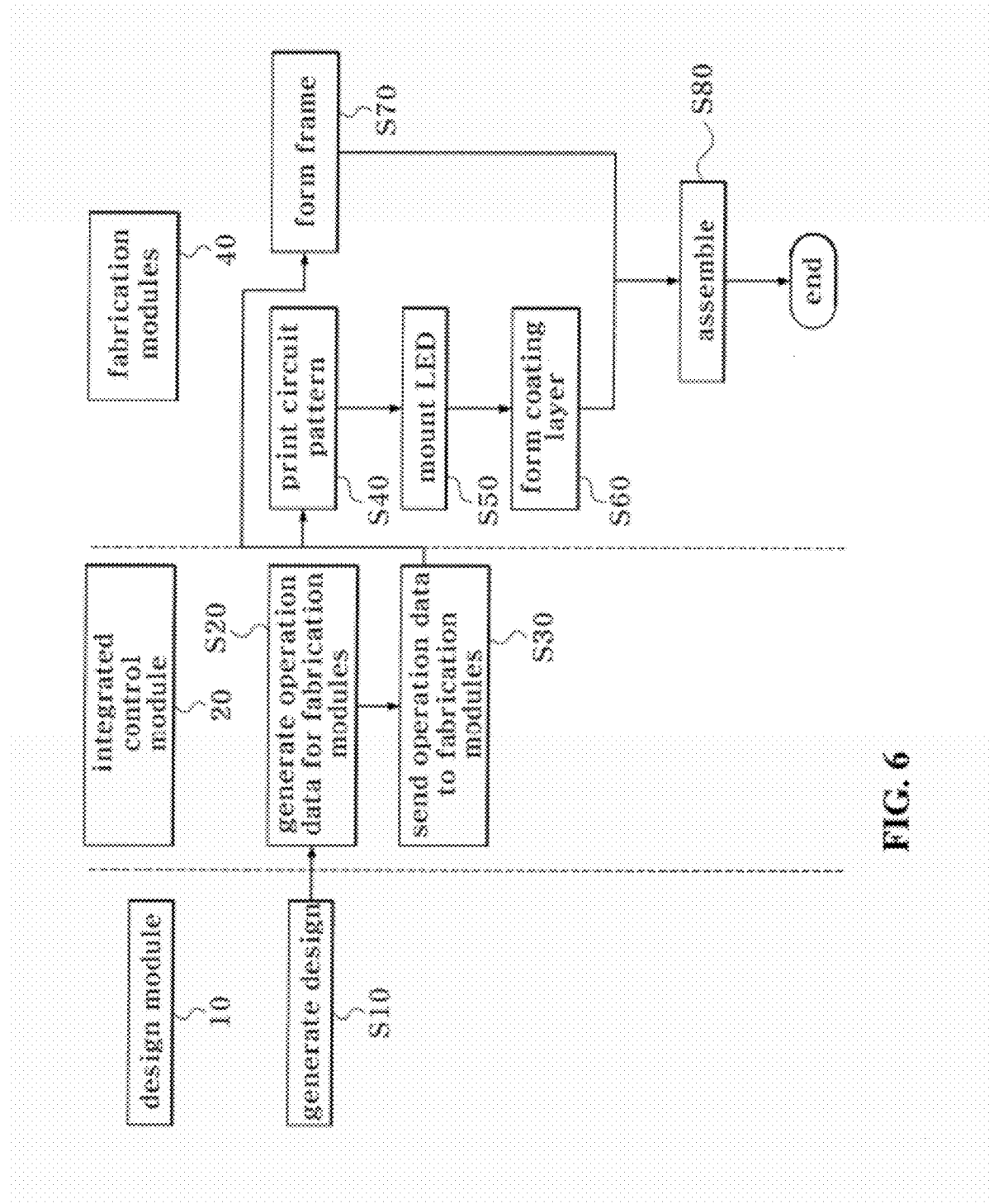
FIG. 6 is a flowchart of an operation process of the apparatus in accordance with an embodiment of the present invention.

FIG. 6 is a flowchart of an operating process of the apparatus in accordance with an embodiment of the present invention.

Referring to FIG. 6, in the operating process of the apparatus for fabricating an LED signboard according to the embodiment, a design is generated in a vector manner through the design module 10 by a user in S10.

In other words, when the user inputs various commands through the input unit 11 to generate a desired design, the graphics processing unit 12 generates the design based on the commands.

In this process, the display unit 15 displays the various designs according to the commands of the user. Further, the output calculation unit 14 calculates an amount of light and a load to be applied to a circuit in installation of LEDs according to the circuit pattern, and displays the amount of light and the load through the display unit 15.

After the designs are generated, the integrated control module 20 extracts process data corresponding to the respective fabrication modules from image data of the designs, which are generated by the design module 10. Then, the integrated control module 20 generates operation data for operation of the fabrication modules 40 by compiling the process data, and sends the operation data to the respective fabrication modules 40, in S30.

In other words, the integrated control module 20 extracts process data from the designs generated by the design module 10, and outputs the process data to the raster image processing unit 21, cutting server 22 and vector pointer server 23.

Here, the raster image processing unit 21 receives the process data indicating the designs, cutting contour line and crop region, converts the process data into pixel pattern data via rasterization, and sends the pixel pattern data to the printer 41 through the interface 30.

The cutting server 22 receives the process data including the designs, cutting contour line and crop region, generates operation data for the cutting plotter 44, channel bender 45 and assembly unit 46 by compiling the process data, and inputs the operation data into the integrated vector data management unit 24.

The vector point server 23 receives process data including a direction vector, dispenser point and crop region, generates operation data for operation of the chip mounter 42 and the dispenser 43 by compiling the process data, and inputs the operation data into the chip mounter 42 and the dispenser 43 through the interface 30.

The raster image processing unit 21, the cutting server 22 and the vector pointer server 23 input the compiled operation data into the integrated vector data management unit 24, which in turn stores the operation data in the file management section.

The printer 41 prints the circuit pattern on the insulation matrix according to the operation data input from the raster image processing unit 21 in S40.

Then, the chip mounter 42 mounts LEDs at certain positions on the insulation matrix according to the operation data input from the vector point server 42, and the dispenser 43 applies a solder paste to the positions to form a coating layer, thereby forming a circuit board, in S50 and S60.

On the other hand, the cutting plotter 44, the channel bender 45 and the assembly unit 46 form a frame according to the operation data input from the integrated vector data management unit 24 in S70. In other words, the contour line is extracted and upper and lateral plates are bent thereby. In addition, the upper, lower and middle plates are cut and assembled to one another in S80, thereby providing a final signboard.

During this process, the conveyor driving unit 47 is operated to move the conveyor belt 48, so that the respective process lines are automatically conveyed to fabricate the signboard.

As such, in the method and apparatus according to the embodiments, operation data for each fabrication module are extracted from designs obtained by creating a vector drawing of a circuit board for an LED module, and are then sent to the fabrication modules to fabricate the LED signboard through the fabrication modules, thereby enabling automation of fabrication of an LED signboard that can emit uniform light through LEDs.

Although some embodiments have been provided to illustrate the invention in conjunction with the drawings, it will be apparent to those skilled in the art that the embodiments are given by way of illustration only, and that various modifications, changes, alterations, and equivalent embodiments can be made without departing from the spirit and scope of the invention. The scope of the invention should be limited only by the accompanying claims.

What is claimed is:

1. A method of fabricating an LED signboard, comprising:
   generating a design;
   forming a circuit pattern by printing in an ink-jet manner the circuit pattern on an insulation matrix with a conductive ink in a pixel pattern based on the design via a printer; and
   mounting an LED on the circuit pattern.

2. The method according to claim 1, wherein the step of forming a circuit pattern comprises extracting process data for the printer from image data of the design and compiling the process data into operation data for operation of the printer.

3. The method according to claim 1, further comprising:
   applying a solder paste to the circuit pattern after mounting the LED on the circuit pattern.

4. The method according to claim 3, further comprising:
   cutting the insulation matrix after mounting the LED on the circuit pattern.

* * * * *